US010971582B2

United States Patent
Hirler et al.

(10) Patent No.: US 10,971,582 B2
(45) Date of Patent: Apr. 6, 2021

(54) METHOD FOR FORMING A SUPERJUNCTION TRANSISTOR DEVICE

(71) Applicant: Infineon Technologies Dresden GmbH & Co. KG, Dresden (DE)

(72) Inventors: Franz Hirler, Isen (DE); Wolfgang Jantscher, Villach (AT); Yann Ruet, Villach (AT); Armin Willmeroth, Friedberg (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 0 days.

(21) Appl. No.: 16/520,484

(22) Filed: Jul. 24, 2019

(65) Prior Publication Data

US 2020/0044019 A1 Feb. 6, 2020

(30) Foreign Application Priority Data

Jul. 31, 2018 (DE) .......................... 102018118442 .5

(51) Int. Cl.
| | |
|---|---|
| *H01L 21/225* | (2006.01) |
| *H01L 29/06* | (2006.01) |
| *H01L 29/66* | (2006.01) |
| *H01L 21/266* | (2006.01) |

(52) U.S. Cl.
CPC ...... *H01L 29/0634* (2013.01); *H01L 21/2253* (2013.01); *H01L 21/266* (2013.01); *H01L 29/66712* (2013.01)

(58) Field of Classification Search
CPC ............. H01L 29/0634; H01L 21/2253; H01L 21/266; H01L 29/66712
USPC ........................................................ 438/530
See application file for complete search history.

(56) References Cited

U.S. PATENT DOCUMENTS

| | | |
|---|---|---|
| 5,155,369 A | 10/1992 | Current |
| 2008/0157074 A1 | 7/2008 | Bernstein |
| 2017/0125514 A9 | 5/2017 | Guan et al. |

FOREIGN PATENT DOCUMENTS

DE 102016113129 B3 11/2017

OTHER PUBLICATIONS

Raineri, V., et al., "Channeling implants in silicon crystals", Materials Chemistry and Physics 38, 1994, 105-130.

*Primary Examiner* — Elias Ullah

(74) *Attorney, Agent, or Firm* — Murphy, Bilak & Homiller, PLLC

(57) ABSTRACT

A method for forming a superjunction transistor device includes: forming a plurality of semiconductor layers one on top of the other; implanting dopant atoms of a first doping type into each semiconductor layer to form first implanted regions in each semiconductor layer; implanting dopant atoms of a second doping type into each semiconductor layer to form second implanted regions in each semiconductor layer. Each of implanting the dopant atoms of the first and second doping types into each semiconductor layer includes forming a respective implantation mask on a respective surface of each semiconductor layer, and at least one of forming the first implanted regions and the second implanted regions in at least one of the semiconductor layers includes a tilted implantation process which uses an implantation vector that is tilted by a tilt angle relative to a normal of the respective horizontal surface of the respective semiconductor layer.

22 Claims, 11 Drawing Sheets

METHOD FOR FORMING A SUPERJUNCTION TRANSISTOR DEVICE

TECHNICAL FIELD

This disclosure in general relates to a method for forming a superjunction transistor device, in particular, for forming a drift region of a superjunction transistor device.

BACKGROUND

A superjunction device, which is often also referred to as a compensation device, includes a drift region with a plurality of regions of a first doping type (conductivity type) and a plurality of regions of a second doping type (conductivity type) complementary to the first doping type. In some publications, the first doping type regions are referred to as drift regions and the second doping type regions are referred to as compensation regions.

The drift region of a superjunction device can be formed by epitaxially growing several semiconductor layers one on top of the other on a substrate by selectively implanting dopant atoms of the first doping type and doping atoms of the second doping type into each of the semiconductor layers, and by a temperature process in which the implanted dopant atoms diffuse in the semiconductor layers such that the regions of the first doping type and the regions of the second doping type are formed. This type of process is sometimes referred to as multi-epi-multi-implant (MEMI) process.

A superjunction device may include a plurality of transistor cells, with each transistor cell including a first doping type region or a section of a first doping type region and a second doping type region or a section of a second doping type region. "The pitch" of a superjunction device is the center distance between two neighboring first doping type regions or between two neighboring second doping type regions. The specific on-resistance $R_{ON}$. A of a transistor device is given by the on-resistance multiplied with the area of a semiconductor body in which the transistor device is implemented. One way to increase the specific on-resistance is to increase the number of transistor cells per unit area. Increasing the number of transistor cells is equivalent to reducing the pitch.

In an MEMI process, the dopant atoms implanted into the individual semiconductor layers diffuse in a vertical direction (which is a direction in which the semiconductor layers are formed one on top of the other) so that the dopant atoms of the first doping type form the first regions and the dopant atoms of the second doping type form the second regions, wherein each of these first and second regions extends across the semiconductor layers in the vertical direction. Diffusion of the dopant atoms, however, is not restricted to the vertical direction, but also includes diffusion in a horizontal direction. The thicker the individual semiconductor layers, the farther the dopant atoms have to diffuse in the vertical and horizontal direction. Reducing the pitch requires reducing the diffusion in the horizontal direction and, consequently, in the vertical direction. This may be achieved by reducing the thickness of the semiconductor layers.

When implanting dopant atoms using an implantation angle of 0°, channeling effects may occur. Such channeling effects, at the same implantation energy, may cause a variation of the implantation depth. The thinner the semiconductor layer in a MEMI process, the greater the impact of channeling effects on a doping profile of the first and second regions may be because the reduced thermal diffusion required with thin semiconductor layers has the effect that the doping profile is very similar to the (varying) implantation profile.

There is therefore a need for an improved method for producing a drift region of a superjunction device.

SUMMARY

One example relates to a method. The method includes forming a plurality of semiconductor layers one on top of the other, implanting dopant atoms of a first doping type into each of the plurality of semiconductor layers, thereby forming a plurality of first implanted regions in each of the plurality of semiconductor layers, and implanting dopant atoms of a second doping type into each of the plurality of semiconductor layers, thereby forming a plurality of second implanted regions in each of the plurality of semiconductor layers. Each of implanting the dopant atoms of the first doping type and implanting the dopant atoms of the second doping type into each of the plurality of semiconductor layers includes forming a respective implantation mask on a respective surface of each of the plurality of semiconductor layers. Further, at least one of forming the first implanted regions and the second implanted regions in at least one of the plurality of semiconductor layers includes a tilted implantation process, wherein the tilted implantation process includes using an implantation vector that is tilted by a tilt angle relative to a normal of the respective horizontal surface of the respective semiconductor layer.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
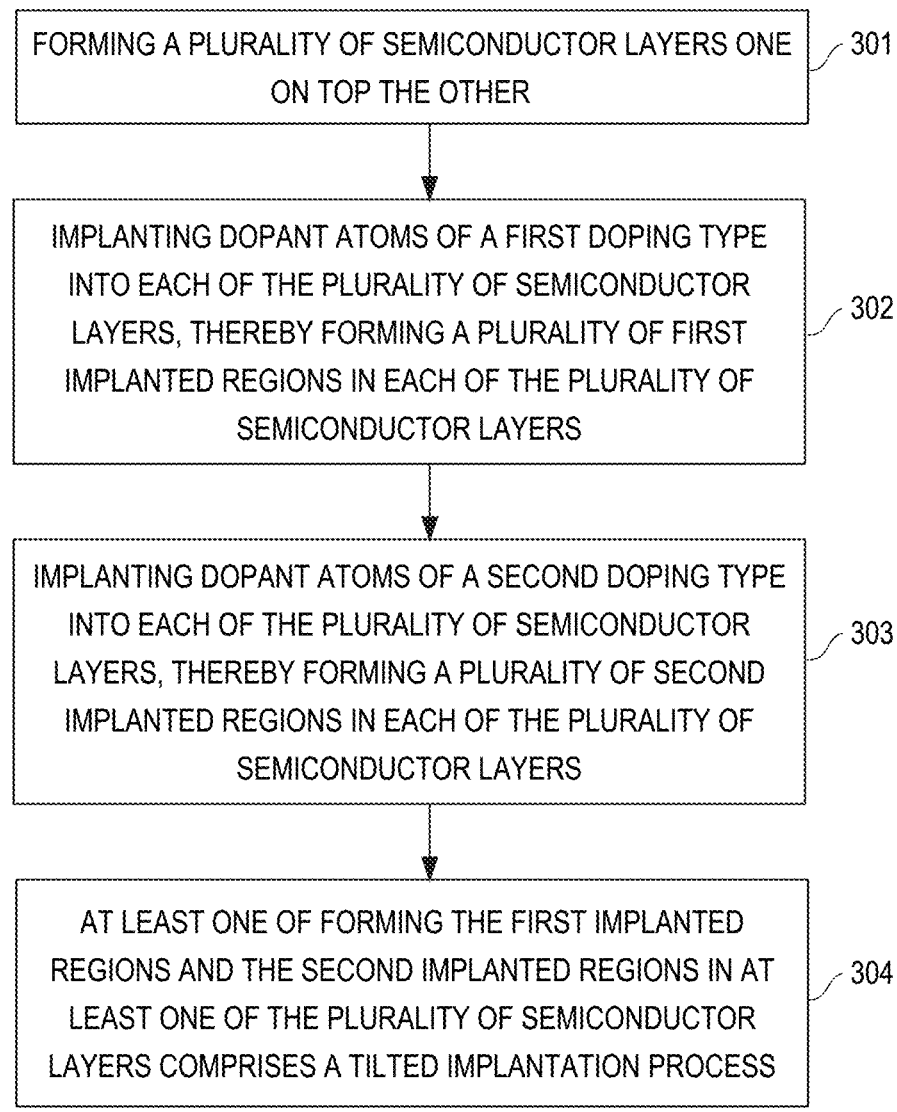
FIG. 1 is a flowchart that illustrates one example of a method for producing a drift region of a superjunction device.

FIG. 1 shows a flowchart that illustrates one example of a method for producing a drift region of a superjunction device. This flowchart illustrates process steps (process sequences) of the method. It should be noted that the order in which the individual process steps are illustrated in FIG. 1 from the top to the bottom of the flowchart does not necessarily represent the order in which these process sequences are performed. Further, some of these process sequences may be performed several times.

Referring to step 301, the method includes forming a plurality of semiconductor layers one on top of the other. Forming each of these semiconductor layers may include an epitaxial growth process so that the plurality of semiconductor layers are epitaxially grown one on top of the other. A first one of the plurality of semiconductor layers may be grown on a semiconductor substrate. According to one example, each of the plurality of semiconductor layers is a monocrystalline semiconductor layer such as, for example, a monocrystalline silicon (Si) layer, a monocrystalline silicon carbide (SiC) layer, a monocrystalline gallium arsenide (GaAs) layer, or a monocrystalline gallium nitride (GaN) layer.

Referring to steps 302 and 303, the method further includes implanting dopant atoms of a first doping type into each of the plurality of semiconductor layers, thereby forming a plurality of first implanted regions in each of the plurality of semiconductor layers, and implanting dopant atoms of a second doping type in each of the plurality of semiconductor layers, thereby forming a plurality of second implanted regions in each of the plurality of semiconductor layers. The second doping type (conductivity type) is complementary to the first doping type (conductivity type). The implanting processes according to steps 302 and 303 take place after a respective one of the plurality of semiconductor layers has been formed and before a next one of the plurality of semiconductor layers is formed. According to one example, implanting the dopant atoms of the first doping type into the respective one of the plurality of semiconductor layers includes forming a first implantation mask on top of a surface of the respective semiconductor layer and implanting the dopant atoms of the first doping type using this first implantation mask. Further, implanting the dopant atoms of the second doping type includes forming a second implantation mask that is different from the first implantation mask on top of the surface of the respective semiconductor layer and using this second implantation mask in the implantation process.

Referring to step 304, at least one of forming the first implanted regions and the second implanted regions in at least one of the plurality of semiconductor layers comprises a tilted implantation process. According to one example, "a tilted implantation process" includes implanting the respective dopant atoms using an implantation vector that is tilted by a tilt angle relative to a normal of the surface of the respective semiconductor layer. According to one example, the tilt angle is between 1° and 15°, in particular between 2° and 8°. The surface of a semiconductor layer into which the dopant atoms of the first and second doping type are implanted is referred to as implantation surface in the following. An implantation process in which the tilt angle is essentially 0° is referred to a non-tilted implantation process in the following.

The tilted implantation process may help to avoid channeling effects. "Channeling" may occur when dopant atoms are implanted into a monocrystalline semiconductor layer in a crystallographic direction in which the atoms of the crystal lattice form a kind of channel so that implanted dopant atoms (dopant ions), at a given implantation energy, penetrate deeper into the semiconductor layer than in other crystallographic directions. For example, channeling may occur when dopant atoms are implanted into a (100) surface of a monocrystalline silicon semiconductor body using a non-tilted implantation process. When implanting dopant atoms into a semiconductor layer in a direction in which channeling may occur, slight variations of the implantation angle, which inevitably occur, may cause variations of the implantation profile. The "implantation profile" is the distribution of the implanted dopant atoms in the semiconductor layer along the implantation direction. Those variations may include that, at a given implantation energy and a given implantation dose, the position of a maximum of the implantation profile relative to the implantation surface may vary or that a distance over which the implantation profile extends in the semiconductor layer may vary. The lower the implantation energy is, the more critical variations of the tilt angle will be with regard to variations in the implantation profile.

In addition to an implantation process, forming a doped semiconductor region in a semiconductor layer includes at least one temperature process in which the implanted dopants are activated and (at least slightly) diffuse in the semiconductor layer. The shorter the temperature process is, the less diffusion will take place. Further, the less diffusion takes place, the better the implantation profile represents the doping profile. Thus, variations in the implantation profile may result in variations of the doping profile. The "doping profile" is the distribution of the activated dopant atoms in the semiconductor layer at the end of the whole processing sequence.

Figure 2:
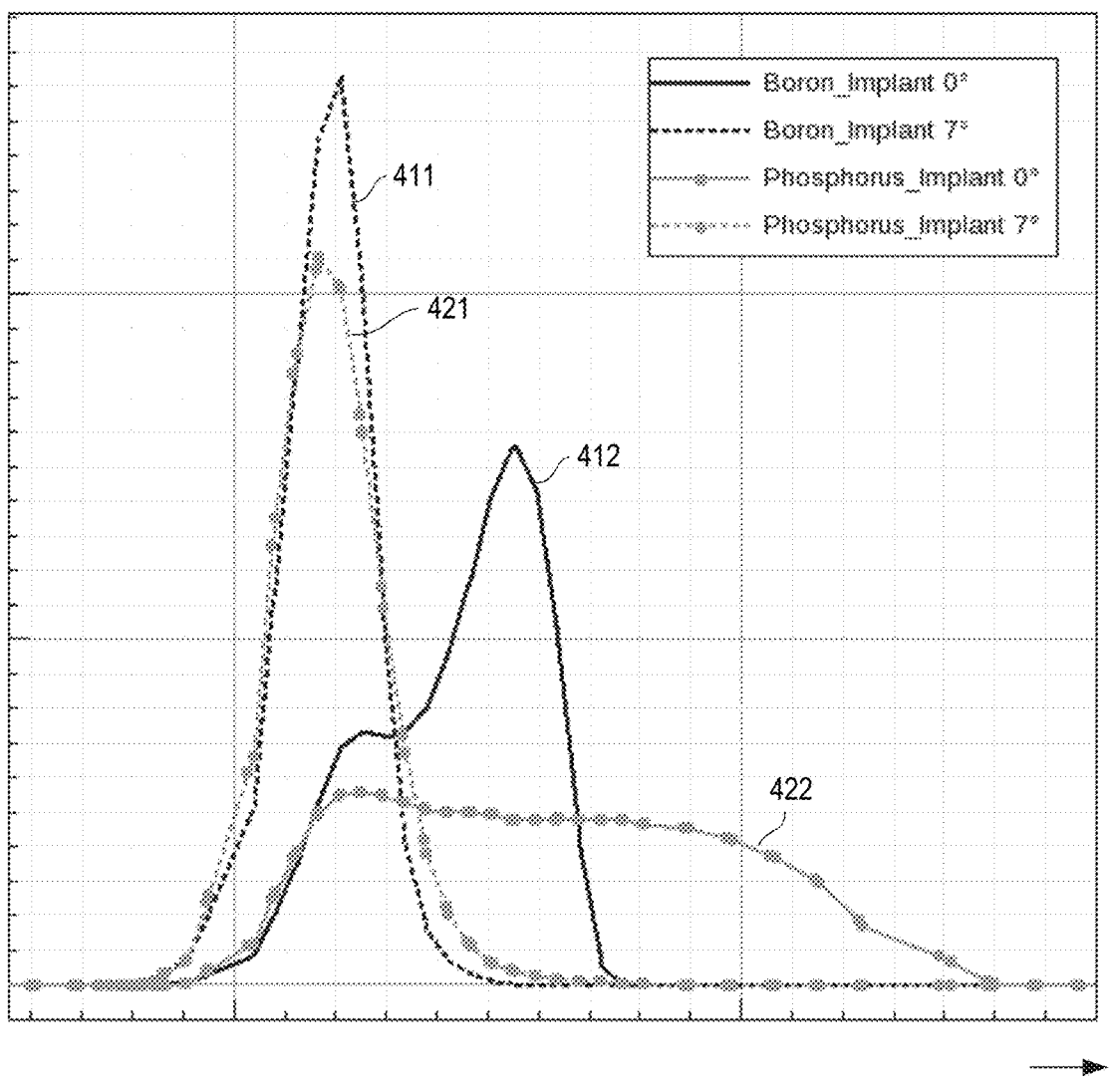
FIG. 2 illustrates doping profiles of doped regions generated based on different types of implantation processes.

FIG. 2 illustrates implantation profiles of four different implanted regions generated based on an implantation process. More specifically, FIG. 2 illustrates the distribution of dopant atoms in a semiconductor layer in a direction z perpendicular to an implantation surface for two different types of dopant atoms, wherein two different implantation processes, a non-tilted implantation process and a tilted implantation process, have been performed for each type of dopant atoms. The implantation dose was the same in each of these implantation processes. The implantation energy was the same for each implantation process of one species (type) of dopant atoms, but different for the different species.

In FIG. 2, curves 411 and 421 represent the doping profiles obtained based on the tilted implantation processes, wherein curve 421 represents the doping profile of a doped region including first type dopant atoms and curve 411 represents the doping profile of a doped region including second type dopant atoms. Further, curves 412 and 422 represent the doping profiles obtained based on the non-tilted implantation processes, wherein curve 422 represents the doping profile of a doped region including first type dopant atoms and curve 412 represents the doping profile of a doped region including second type dopant atoms. As can be seen from FIG. 2, the non-tilted implantation process has the effect that the dopant atoms penetrate deeper into the semiconductor layer and the implanted region, in the vertical direction z, extends over a wider range than in the tilted implantation process. The latter has the effect that a maximum concentration of implanted atoms that is obtained based on the non-tilted implantation process is lower than in the tilted implantation process. In other words, the implantation profiles obtained based on the tilted implantation process are narrower and have sharper edges.

The doping profiles shown in FIG. 2 have been obtained based on implanting boron (B) atoms as second type dopant atoms and phosphorous atoms (P) as first type dopant atoms into a (100) surface of a silicon (Si) semiconductor layer using a tilt angle of 0° in the non-tilted implantation process and 7° in the tilted implantation process. This, however, is only an example. Similar results are obtained when using other types of dopant atoms, other types of semiconductor layers, and other tilt angles in the tilted implantation process.

Summarizing the above, the risk of (unpredictable) variations in the doping profile of a doped region increases as the implantation energy decreases and as the duration of the temperature process decreases. On the other hand, forming a drift region of a superjunction device with a low pitch may include producing relatively thin semiconductor layers one on top of the other, implanting dopant atoms at a low implantation energy into the individual semiconductor layers, and a short temperature process. Further, in a superjunction device, there are at least some positions of the drift region where unpredictable variations of the doping profile are highly undesirable, especially if variations in the doping profile of first and second species are not identical. A tilted implantation process may help to avoid or at least reduce such variations.

Figure 3A:
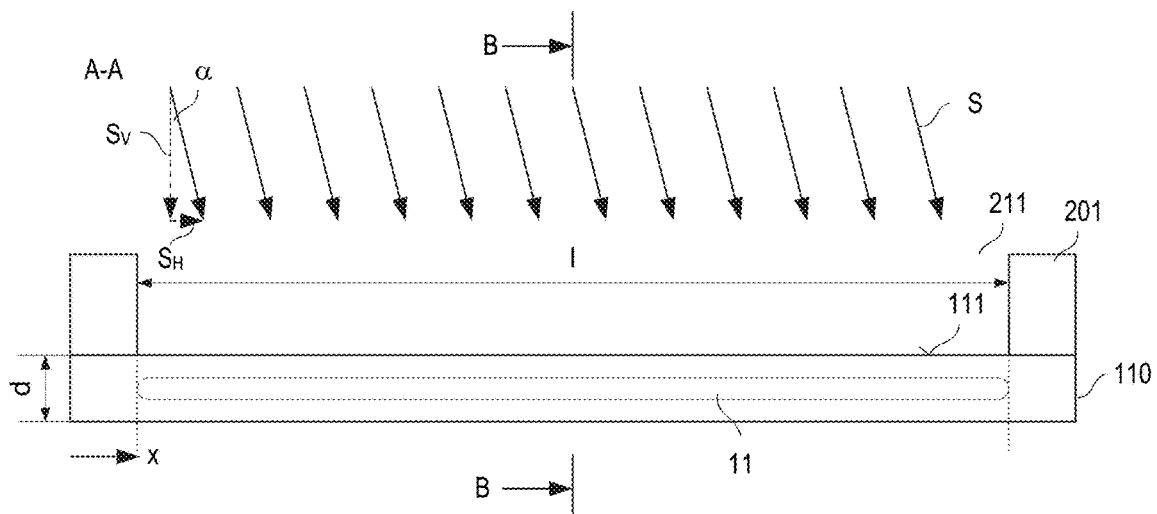
FIGS. 3A-3C show one example of a method for forming an implanted region in a semiconductor layer using a tilted implantation process.
Figure 3B:
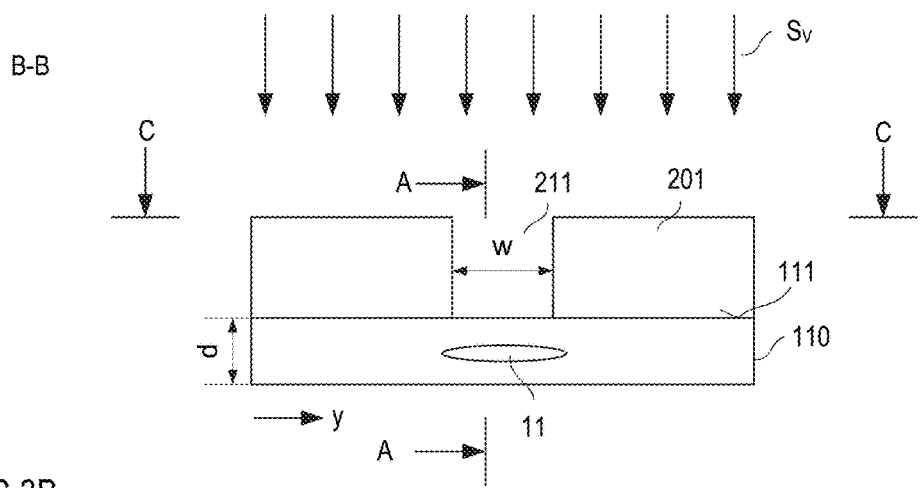
Figure 3C:
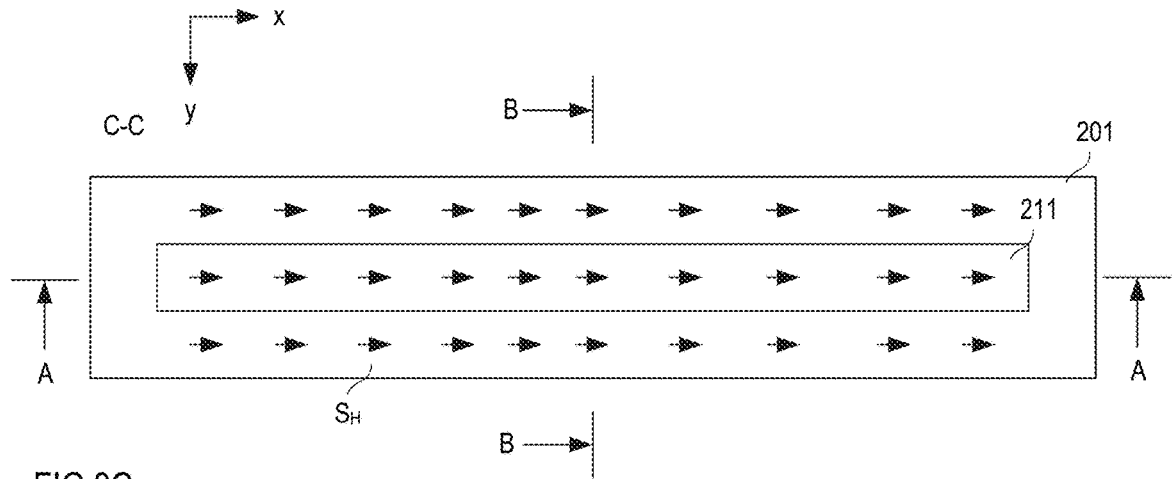

FIGS. 3A-3C illustrate one example of a tilted implantation process for forming a first implanted region 11 in a semiconductor layer 110. In FIGS. 3A-3C only one semiconductor layer 110 is shown which represents an arbitrary one of the plurality of semiconductor layers formed in the method. Further, in FIGS. 3A-3C only one first implanted region 11 is shown. It goes without saying that a plurality of first implanted regions can be formed in the semiconductor layer 110 spaced apart from each other by the same implantation process. FIG. 3A shows a vertical cross-sectional view of the semiconductor layer 110 in a first section plane A-A, FIG. 3B shows a vertical cross-sectional view of the semiconductor layer 110 in a second section plane B-B perpendicular to the first section plane A-A, and FIG. 3C shows a top view of the semiconductor layer 110. The first and second vertical section planes A-A, B-B are section planes perpendicular to a first surface 111 of the semiconductor layer 110. This first surface 111 is the surface into which the dopant atoms are implanted and is referred to as implantation surface 111 in the following. According to one example, the semiconductor layer 110 is a monocrystalline silicon semiconductor layer and the implantation surface 111 is a (100) surface of the crystal lattice of the monocrystalline semiconductor layer 110.

Referring to FIGS. 3A-3C, the tilted implantation process includes forming an implantation mask 201 on top of the implantation surface 111. The implantation mask 201 includes at least one opening 211 in which a section of the implantation surface 111 is uncovered. In the implantation process, the first implanted region 11 is formed in the semiconductor layer 110 below the opening 211 of the implantation mask 201. In FIGS. 3A and 3B only one first implanted region 1 is shown. A plurality of first implanted regions 1 can be formed by forming the implantation mask 201 such that it includes a plurality of openings 211 that are spaced apart from each other in a lateral direction of the semiconductor layer 210. A "lateral direction" is a direction parallel to the implantation surface 111.

In the implantation process, a direction in which the dopant atoms are implanted into the implantation surface 111 is given by an implantation vector S. In the tilted implantation process, the implantation vector S has a vertical component $S_V$ and a horizontal component $S_H$. The vertical component $S_V$ is perpendicular to the implantation surface 111 and, therefore, parallel to a normal of the implantation surface 111. The horizontal component $S_H$ is parallel to the implantation surface 111 and, therefore, perpendicular to the normal of the implantation surface 111. In the tilted implantation process, the horizontal component $S_H$ is different from zero. In a non-tilted implantation process (not illustrated in FIGS. 3A-3C), the horizontal component $S_H$ is essentially zero. The tilt angle α is the angle between the implantation vector S and the normal of the implantation surface 111. Based on the vertical component $S_V$ and the horizontal component $S_H$ of the implantation vector S the implantation angle α is given by $$\alpha = \arctan \frac{S_H}{S_V}.$$

The tilt angle α is different from 0° in the tilted implantation process and essentially 0° in the non-tilted implantation process.

According to one example, the opening 211 in the implantation mask 201 is an elongated opening such that a length l of the opening 211 in a first lateral direction x of the semiconductor layer 110 is significantly greater than a width w of the opening 211 in a second lateral direction y perpendicular to the first lateral direction x. According to one example, a ratio l:w between the length and the width of the opening 211 is at least 10:1, at least 100:1, or at least 1000:1. The first lateral direction x is also referred to as longitudinal direction of the opening 211 in the following. According to one example, the implantation vector S is such that in the tilted implantation process the horizontal component $S_H$ is essentially parallel to the longitudinal direction x of the opening 211. This is in order to prevent or at least widely prevent dopant atoms from being implanted into the semiconductor layer 110 in regions that are below the implantation mask 201 and into sidewalls of the implantation mask 201. Such implantation of dopant atoms into a region of the semiconductor layer 110 below the implantation mask 201 may only occur at longitudinal ends of the openings 211, where such implantation can be ignored.

According to one example, the tilt angle α is selected from between 1° and 15°, in particular from between 2° and 8°. According to one example, a thickness d of the semiconductor layer 110, which is a dimension of the semiconductor layer 110 in a direction perpendicular to the implantation surface 111, is less than 2.5 micrometers (μm) or less than 2 micrometers. According to one example, the thickness d is between 1.5 micrometers and 2 micrometers.

The implantation energy is dependent on the thickness d of the semiconductor layer 110 and the type of dopant atoms that are implanted. Basically, the thicker the semiconductor layer 110, the higher the implantation energy. Further, the lighter the implanted dopant atoms are, the lower the implantation energy will be. According to one example, the implanted dopant atoms are boron (B) atoms, which are p-type dopants in silicon, and the implantation energy is selected from between 50 keV and 300 keV. According to another example, the implanted dopant atoms are phosphorous (P) atoms, which are n-type dopants in silicon, and the implantation energy is selected from between 100 keV and 600 keV. According to one example, the implantation dose is selected from between 2E12 cm$^{-2}$ and 5E13 cm$^{-2}$.

Figure 4A:
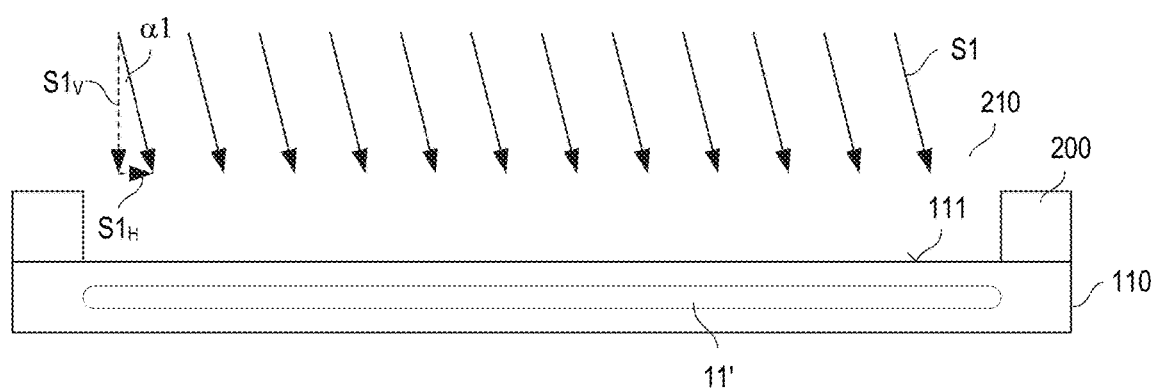
FIGS. 4A-4B show a modification of the method illustrated in FIGS. 3A-3C.
Figure 4B:
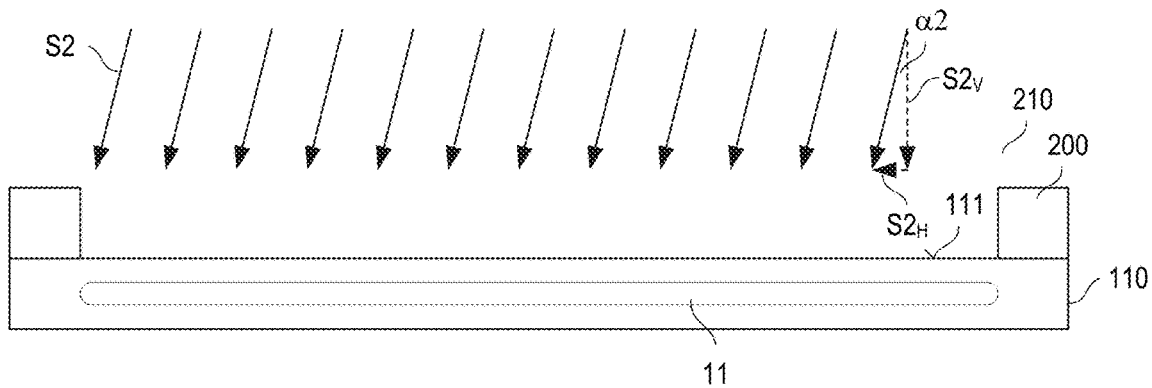

According to one example illustrated in FIGS. 4A and 4B, the tilted implantation process includes two implantation sub-processes, a first sub-process using a first implantation vector S1 and a second sub-process using a second implantation vector S2. Each of these sub-processes can be in accordance with the method explained with reference to FIGS. 3A-3C, wherein the two sub-processes are different from each other in that a horizontal component $S1_H$ of the first implantation vector S1 in the first sub-process and the horizontal component $S2_H$ of the implantation vector S2 in the second sub-process have opposite directions, wherein each of these directions may be parallel to the longitudinal direction of the opening 211 in the implantation mask 201. According to one example, the horizontal component $S1_H$ of the first implantation vector S1 and the horizontal component $S2_H$ of the second implantation vector S2 have essentially the same absolute value (but opposite directions) and vertical components $S1_V$, $S2_V$ of the first and second implantation vectors S1, S2 have essentially the same absolute value (and essentially the same direction). In this case, a first tilt angle α1 in the first sub-process illustrated in FIG. 4A and a second tilt angle α2 in the second sub-process shown in FIG. 4B have the same absolute value but different signs, that is, α1=−α2. "Essentially" in this context means that each of the two values that are essentially the same deviates less than 5% or even less than 1% from an average of the two values.

In the tilted implantation process illustrated in FIGS. 4A and 4B, a first portion 11' of the first implanted region is produced in the first sub-process shown in FIG. 4A and the first implanted region 11 is finished by the second sub-process shown in FIG. 4B.

Having an implantation mask 200 with an elongated opening 210 in order to form an elongated implanted region 11 is only an example. The opening in the implantation mask may have any form that is adapted to the desired form of the implanted region. According to one example, the implantation process includes more than two sub-processes. The implantation process may include four sub-processes, wherein the implantation vectors used in these four implantation processes may have the same absolute value and the same vertical components, but distinct horizontal components. According to one example, the horizontal components are selected such that an angle between each pair of these horizontal components is 90° or a multiple of 90°.

According to one example, one implantation process or implantation sub-process may include two or more different implantations using the same implantation angle, but different implantation energies. According to another example, one implantation process or implantation sub-process may include two or more different implantations using the same energy or different energies and different implantation angles, so that one of these implantations can be a non-tilted implantation and at least one further implantation can be a tilted implantation.

Figure 5A:
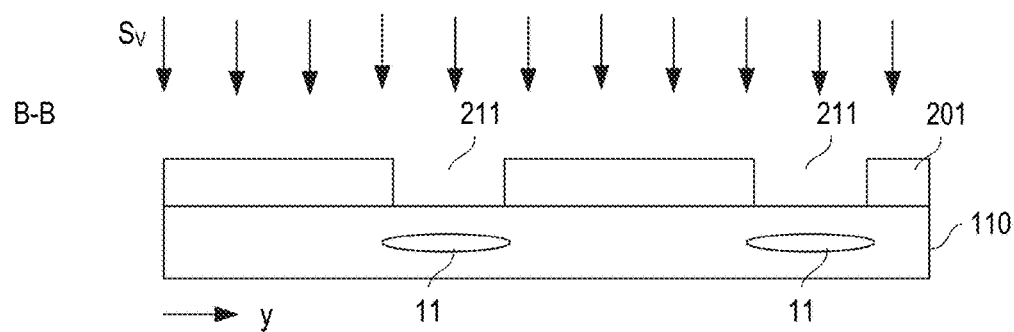
FIGS. 5A-5C illustrate one example of a method for forming implanted regions of a first doping type and implanted regions of a second doping type in a semiconductor layer.

Referring to the above, a plurality of first implanted regions 11 can be formed in one tilted implantation process. This is illustrated in FIG. 5A that shows a vertical cross-sectional view of the semiconductor layer 110 in the second vertical section plane B-B. In this example, the implantation mask 201 includes a plurality of openings 211 (wherein only two openings 211 are shown in FIG. 5A) that are spaced apart from each other in the second lateral direction y. According to one example, each of these openings 211 is an elongated opening of the type explained with reference to FIGS. 3A-3C. The implantation process illustrated in FIG. 5A is a tilted implantation process of any of the types explained hereinbefore, wherein in FIG. 5A only the vertical component $S_V$ of the implantation vector is illustrated. The tilted implantation process illustrated in FIG. 5A may include any of the tilted implantation processes illustrated in FIGS. 3A-3C or 4A and 4B.

Figure 5B:
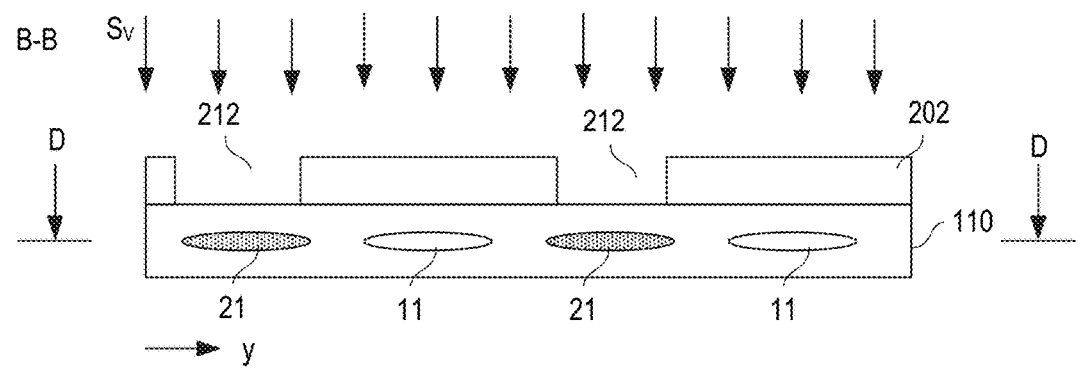

Referring to the above, a plurality of first implanted regions 11 that each include dopant atoms of the first doping type and a plurality of second implanted regions 21 that each include dopant atoms of a second doping type complementary to the first doping type may be produced in the same semiconductor layer 110. FIG. 5B shows a vertical cross-sectional view of the semiconductor layer 110 in a second tilted implantation process in which a plurality of second implanted regions 21 are formed in the semiconductor layer 110. Forming these second implanted regions 21 includes forming a second implantation mask 202 on top of the implantation surface 111 of the semiconductor layer 110. This second implantation mask 202 includes a plurality of openings 212 in which the implantation surface 111 is uncovered. Theses openings 212 may be elongated openings of the type explained with reference to FIGS. 3A-3C. Further, a position of these openings 212 may be selected such that the first implanted regions 11 and the second implanted regions 21 are spaced apart from each other in the second lateral direction y. Everything else explained with regard to the tilted implantation process that forms the first implanted regions 11 applies to the second tilted implantation process that forms the second implanted regions 21 equivalently. According to one example, the implantation vector is the same in the first implantation process and the second implantation process.

Figure 5C:
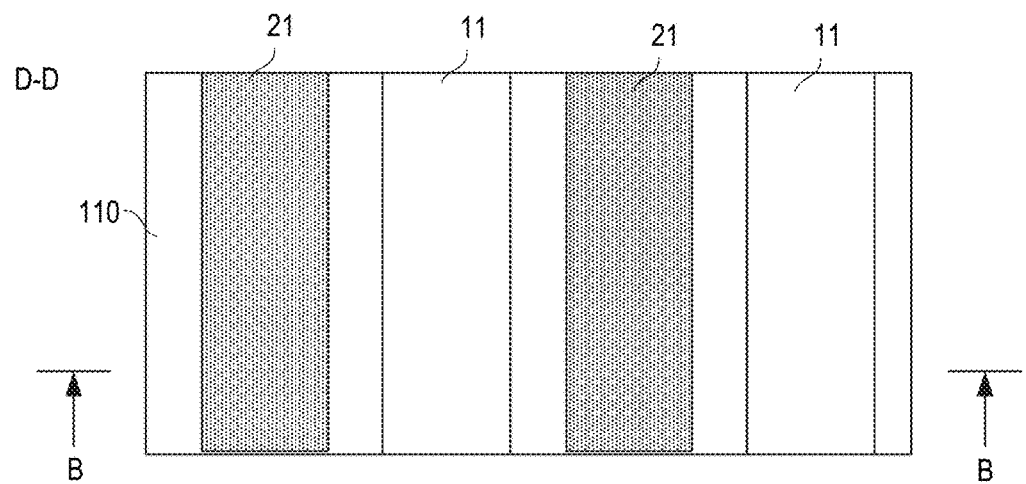

FIG. 5C shows a horizontal cross-sectional view of the semiconductor layer 110 in a horizontal section plane D-D after the second tilted implantation process. In this example, the first implanted regions 11 and the second implanted regions 21 are elongated regions that are essentially parallel to each other. This structure can be obtained by implementing the first and second implantation mask such that the openings 211 in the first implantation mask 201 used in the first implantation process and the openings 212 in the second implantation mask 202 used in the second implantation process are elongated openings that have the same longitudinal direction.

The semiconductor layer 110 in which the first implanted regions 11 and the second implanted regions 21 are formed can be undoped (not intentionally doped) or can have a basic dopant concentration of one of the first and second doping types. "Undoped" means that a doping concentration of the semiconductor layer 110 is less than 1E14 (=10$^{14}$) cm$^{-3}$. A basic doping concentration of the semiconductor layer 110 can be produced during an epitaxial growth process in which the semiconductor layer 110 is produced.

Figure 6:
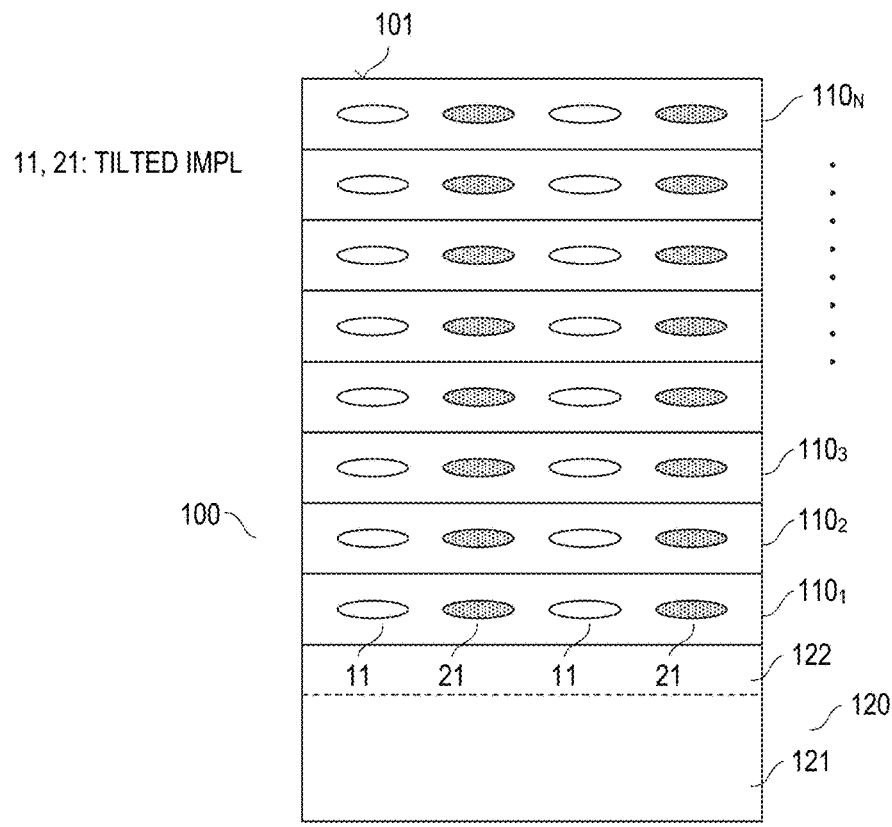
FIGS. 6-11 illustrates different examples of a semiconductor body having a plurality of semiconductor layers, wherein each of the semiconductor layers includes a plurality of implanted regions of the first doping type and implanted regions of the second doping type.

Referring to FIG. 1, the method includes forming a plurality of semiconductor layers one on top of the other and forming a plurality of first implanted regions and a plurality of second implanted regions in each of the plurality of semiconductor layers. FIG. 6 shows a horizontal cross-sectional view of a semiconductor arrangement that includes a plurality of semiconductor layers $110_1$-$110_n$ formed one on top of the other, wherein a plurality of first implanted regions 11 and a plurality of second implanted regions 21 have been formed in each of these semiconductor layers $110_1$-$110_n$. According to one example, a tilted implantation process is used to form the first implanted regions 11 and the second implanted regions 21 in each of the plurality of semiconductor layers $110_1$-$110_n$, wherein the tilted implantation process can be any type of tilted implantation process explained with reference to FIGS. 3A-3C, 4A and 4C and 5A-5B herein before. According to one example, the first implanted regions 11 and the second implanted regions 21 in the plurality of semiconductor layers $110_1$-$110_n$ are produced such that in the overall semiconductor arrangement 100 a plurality of first implanted regions 11 are formed one on top of the other in a vertical direction of the semiconductor arrangement 100 and a plurality of second implanted regions 21 are formed one on top of the other in the vertical direction of the semiconductor arrangement 100. The "vertical direction of the semiconductor arrangement 100" is a direction perpendicular to a first surface 101 of the semiconductor arrangement 100. The first surface 101, according to one example, is the implantation surface $111_n$ of an uppermost semiconductor layer 110n. The "uppermost semiconductor layer $110_n$" is the semiconductor layer manufactured last in the manufacturing process.

According to one example, a lowermost semiconductor layer $110_1$, which is the semiconductor layer manufactured first in the manufacturing process, is formed on top of a carrier 120. According to one example, the lowermost semiconductor layer, which is also referred to as first semiconductor layer $110_1$ in the following, is epitaxially grown on a monocrystalline semiconductor carrier 120. A second semiconductor layer $110_2$, after forming the first and second implanted regions 11, 21 in the first semiconductor layer $110_1$, is epitaxially grown on the first semiconductor layer $110_1$, a third semiconductor layer $110_3$, after forming the first and second implanted regions 11, 21 in the second semiconductor layer $110_2$ is epitaxially grown on the second semiconductor layer $110_2$, and so on. According to one example, the carrier 120 is a semiconductor substrate with an essentially homogenous basic doping of the first doping type. The doping concentration is higher than 1E18 cm$^{-3}$, for example.

According to another example illustrated in dashed lines in FIG. 6, the carrier 120 includes a substrate 121 of the first doping type with a doping concentration of higher than 1E18 cm$^{-3}$ and a buffer layer 122 of the first doping type formed on the substrate 121 and having a doping concentration lower than the doping concentration of the substrate 121. The buffer layer 122 may include one or more epitaxial layers grown on the substrate.

According to one example, the doping concentration of the buffer layer 122 is between 1E15 cm$^{-3}$ and 1E18 cm$^{-3}$, in particular, between 1E15 cm$^{-3}$ and 1E16 cm$^{-3}$. According to one example, the buffer layer 122 includes two epitaxial layers, a first epitaxial layer grown on the substrate 121 and having a first doping concentration, and a second epitaxial layer grown on the a first epitaxial layer and having a second doping concentration lower than the first doping concentration. According to one example, a thickness of the buffer layer 122, which is the dimension of the buffer layer 122 in a direction facing away from the substrate 121, is between 5 micrometers and 25 micrometers, in particular, between 10 micrometers and 20 micrometers. The buffer layer 122 can be in-situ doped during the at least one epitaxial growth process performed to form the buffer layer 122. Alternatively, dopant atoms of the first doping type are implanted into the at least one epitaxial layer forming the buffer layer 122 all over the surface of the at least one epitaxial layer surface. In the latter case, the doping concentration of the buffer layer 122 is obtained after a temperature process that activates and diffuses the implanted dopant atoms. This temperature process may be the same temperature process that activates and diffuses the dopant atoms in the epitaxial layers $110_1$-$110_N$ formed on the carrier 120, so that this temperature process may take place after theses epitaxial layers $110_1$-$110_N$ have been formed.

According to one example, each of the plurality of semiconductor layers $110_1$-$110_n$ formed on the carrier 120 is produced such that it is undoped (not intentionally doped). According to another example, a group of lowermost semiconductor layers have a basic doping of the first doping type and the remainder of the plurality of semiconductor layers are produced to be undoped. According to one example, the doping concentration of the basic doping is selected from the same range as the doping concentration of the buffer layer 122. The "group of lowermost semiconductor layers" at least includes the lowermost semiconductor layer $110_1$ and may include one further semiconductor layer $110_2$ formed on top of the lowermost layer $110_1$ or several further semiconductor layers formed one on top of the other on the uppermost layer $110_1$.

According to one example, the at least one lowermost semiconductor layer that is formed to have a basic doping has a thickness that is greater than the thicknesses of the remainder of the plurality of semiconductor layers. According to one example, the at least one lowermost semiconductor layer is thicker than 2.5 micrometers and the remainder of the plurality of semiconductor layers have a thickness less than 2.5 micrometers, in particular less than 2 micrometers. According to one example, only the lowermost semiconductor layer $110_1$ is formed to have a basic doping.

In the example illustrated in FIG. 6, the first implanted regions 11 and the second implanted regions 21 in each of the plurality of semiconductor layers $110_1$-$110_n$ have been produced using a tilted implantation process. This, however, is only an example. According to further examples explained in the following at least some of the first implanted regions and the second implanted regions produced in the overall semiconductor arrangement 100 can be produced using a non-tilted implantation process. In the drawings explained below, reference character 11 denotes a first implanted region produced using a tilted implantation process, reference character 12 denotes a first implanted region produced using a non-tilted implantation process, reference character 21 denotes a second implanted region produced using a tilted implantation process, and reference character 22 denotes a second implanted region produced using a non-tilted implantation process.

Figure 7:
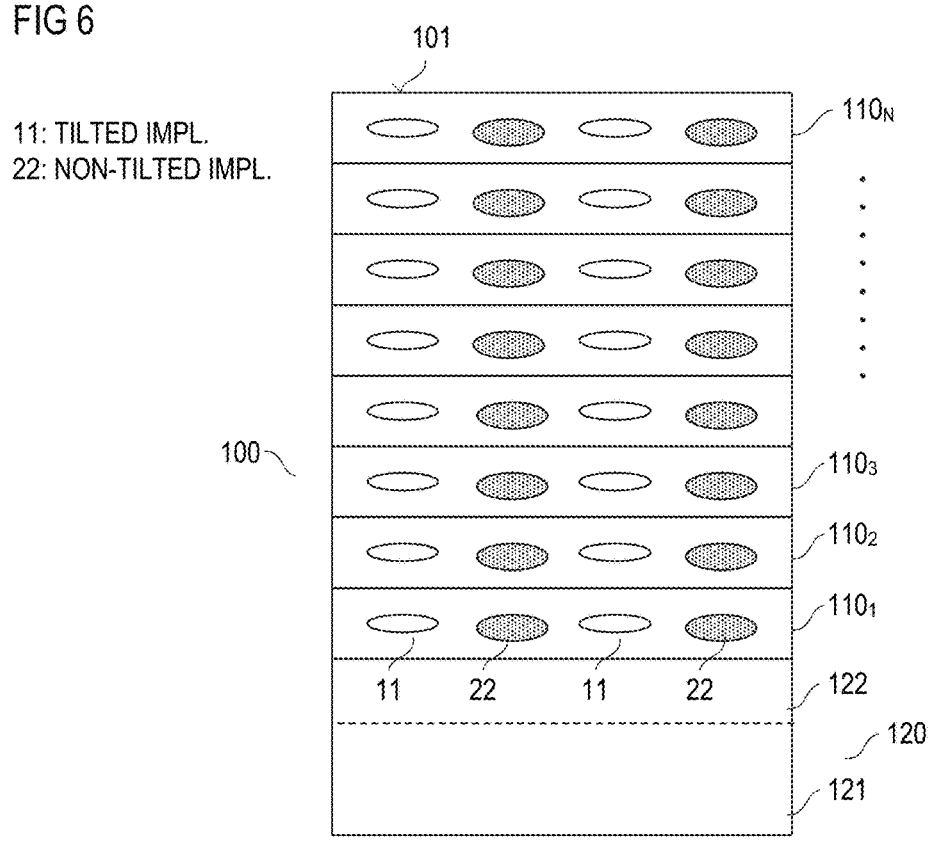

FIG. 7 shows a semiconductor arrangement 100 that is different from the semiconductor arrangement shown in FIG. 6 in that each of the second implanted regions 22 in each of the semiconductor layers $110_1$-$110_n$ has been produced using a non-tilted implantation process while the first implanted regions 11 in each of the plurality of semiconductor layers $110_1$-$110_n$ has been produced using a tilted implantation process.

Figure 8:
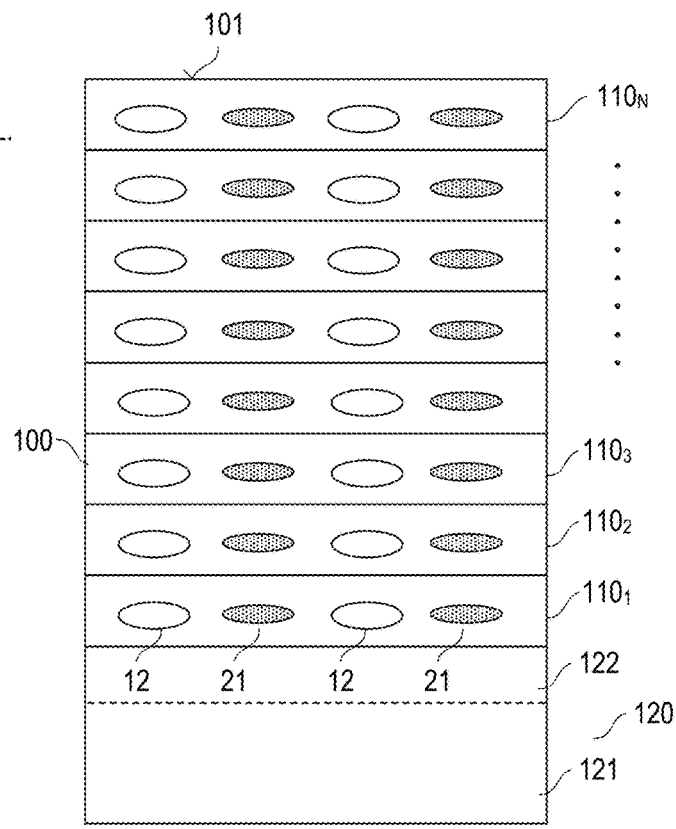

FIG. 8 shows a further modification of the semiconductor arrangement 100 shown in FIG. 6. The arrangement 100 shown in FIG. 8 is different from the arrangement shown in FIG. 6 in that the first implanted regions 12 in each of the plurality of semiconductor layers $110_1$-$110_n$ are implanted regions produced using a non-tilted implantation process while the second implanted regions 12 in each of the plurality of semiconductor layers $110_1$-$110_n$ are implanted regions produced using a tilted implantation process.

According to another example, the first implanted regions and/or the second implanted regions in only one or several of the semiconductor layers $110_1$-$110_n$ are produced using a tilted implantation process while first implanted regions and/or second implanted regions in the remainder of the plurality of semiconductor layers $110_1$-$110_n$ are produced using a non-tilted implantation process.

Figure 9:
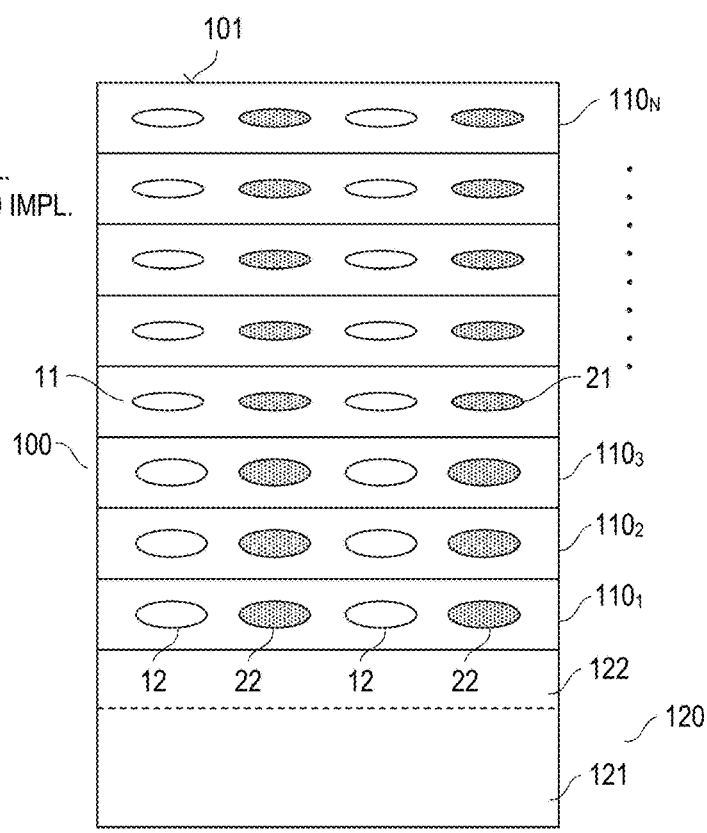

FIG. 9 shows one example of an arrangement that includes a first group of semiconductor layers in which the first implanted regions 12 and the second implanted regions 22 are implanted regions produced using a non-tilted implantation process. In a second group of semiconductor layers the first implanted regions 11 and the second implanted regions 12 are implanted regions produced using a tilted implantation process. According to one example, the first group of semiconductor layers includes the first semiconductor layer $110_1$ and at least one further layer, wherein the semiconductor layers $110_1$-$110_3$ of the first group are formed one on top of the other. Equivalently, the semiconductor layers of the second group include the uppermost semiconductor layer $110_n$ and the semiconductor layers of the second group are formed one on top of the other.

Figure 10:
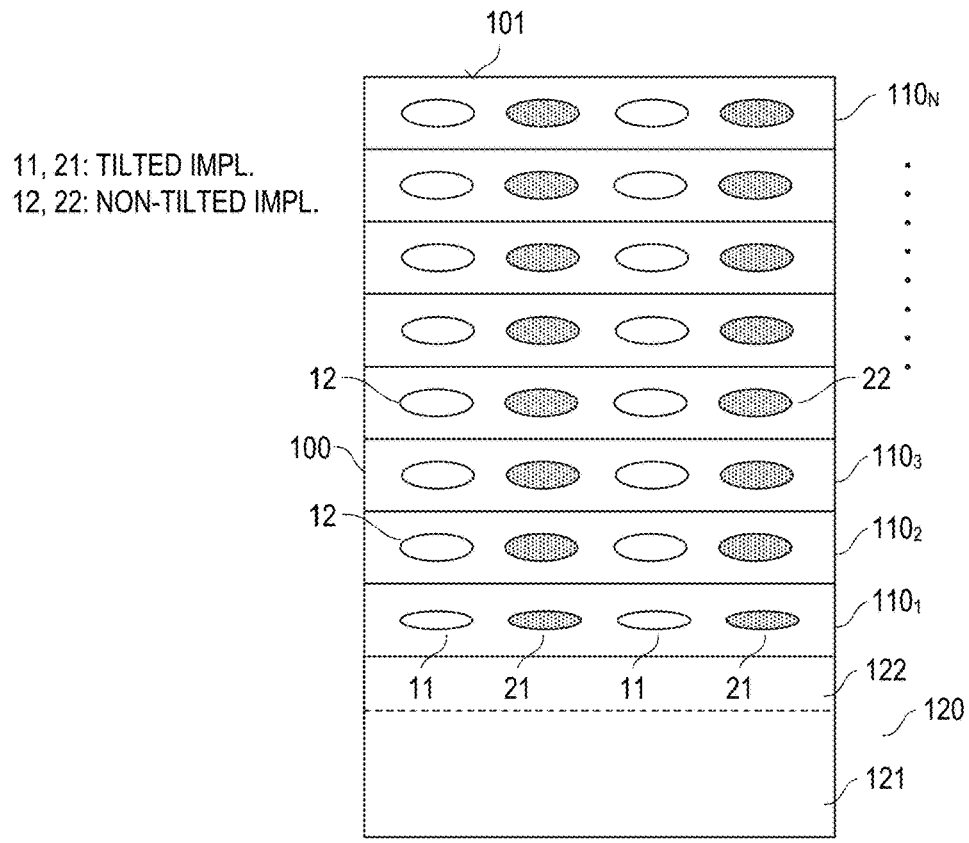

According to another example shown in FIG. 10, the first implanted regions 11 and the second implanted regions 21 of only the first semiconductor layer $110_1$ are implanted regions produced using a tilted implantation process and the first implanted regions 12 and the second implanted regions 22 produced in the remainder of the semiconductor layers $110_2$-$110_N$ are implanted regions produced using a non-tilted implantation process.

Figure 11:
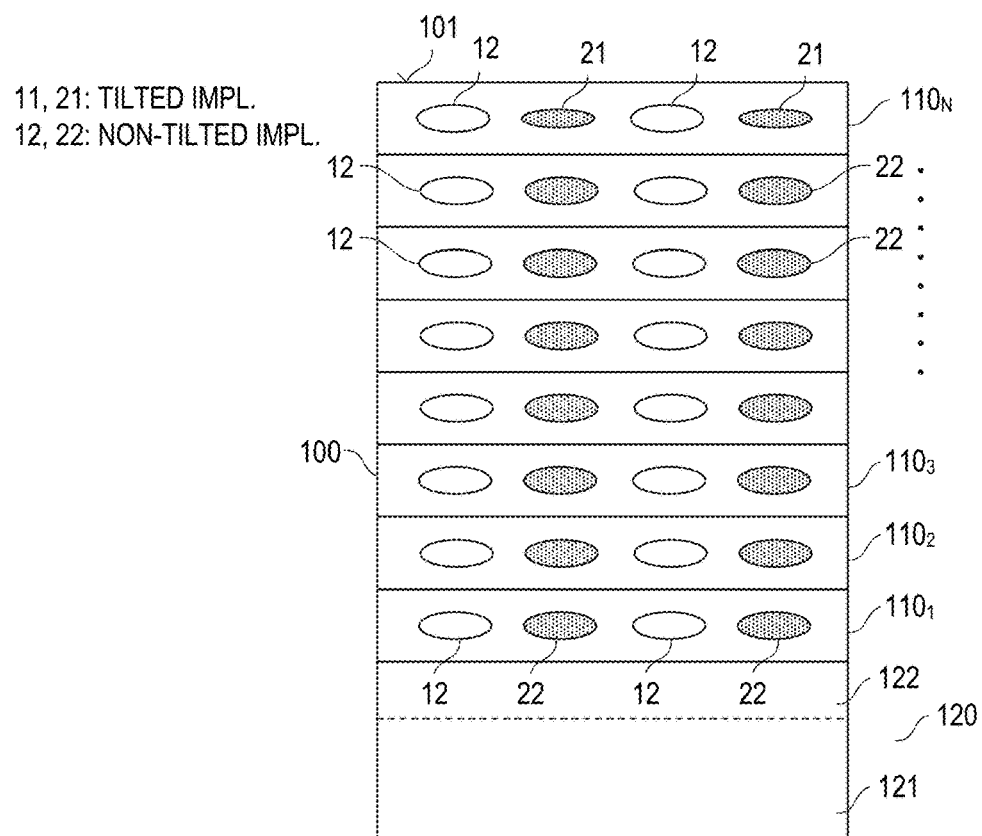

FIG. 11 shows a further example of a semiconductor arrangement 100. In this example, only the second implanted regions 21 formed in the uppermost semiconductor layer $110_N$ are implanted regions produced using a tilted implantation process and the second implanted regions 22 in each of the other semiconductor layers $110_1$-$110_{N-1}$ and each of the first implanted regions 12 are implanted regions produced using a non-tilted implantation process. According to another example (not shown), the second implanted regions and the first implanted regions in only the uppermost semiconductor layer $110_N$ are implanted regions produced using a tilted implantation process, while the second implanted regions and the first implanted regions in each of the other semiconductor layers $110_1$-$110_{N-1}$ are implanted regions produced using a non-tilted implantation process.

According to yet another example, only the second implanted regions 22 of the uppermost semiconductor layer $110_N$ are implanted regions produced using a non-tilted implantation process, all other implanted regions 21, 22 are implanted regions produced using a tilted implantation process.

The semiconductor arrangement with the substrate 120 and plurality of semiconductor layers $110_1$-$110_n$ is a monocrystalline semiconductor arrangement. That is, based on the crystalline structure of the semiconductor arrangement 100 the substrate 120 and the semiconductor layers $110_1$-$110_n$ cannot be detected. In other words, there is no visible border or interface between the substrate 120 and the individual semiconductor layers $110_1$-$110_n$. Nevertheless, for the purpose of illustration and explanation, a border between the substrate 120 and the semiconductor layers $110_1$-$110_n$ is illustrated by solid horizontal lines in FIGS. 6-11.

In addition to the implantation processes explained hereinbefore, forming a drift region of a superjunction transistor device includes a temperature process in which the implanted dopant atoms are activated and (slightly) diffuse in the semiconductor layers $110_1$-$110_n$. According to one example, a temperature in the temperature process is higher than 1000° C., such as, for example, between 1050° C. and 1100° C. and a duration of the plateau phase (which is when the temperature is higher than 1000° C.) is longer than 10 minutes such as, for example between 15 minutes and 90 minutes. The temperatures process may take place in an oxidizing atmosphere or an inert atmosphere. According to one example, the temperature process is a furnace process.

Figure 12:
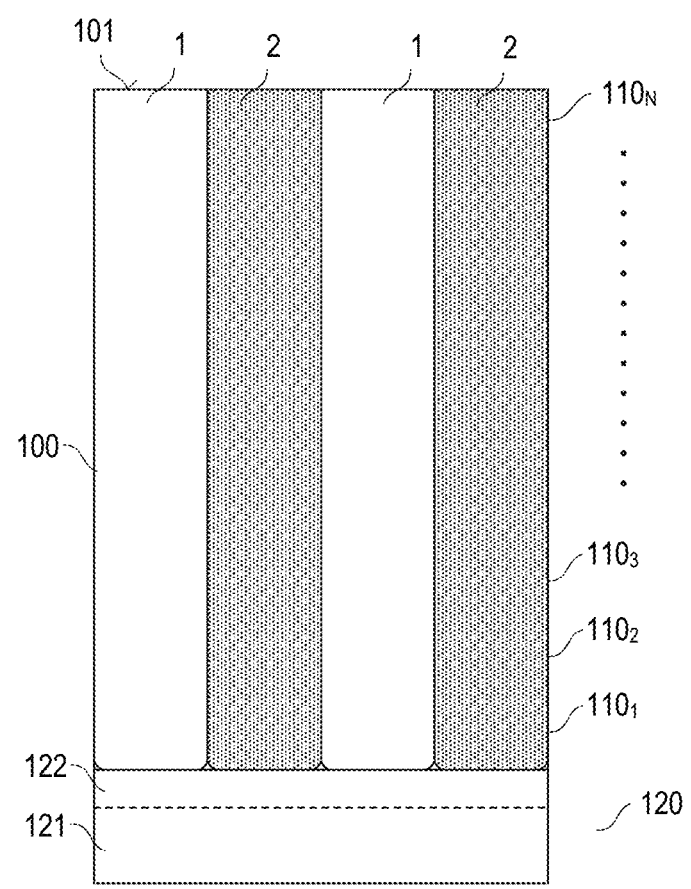
FIG. 12 shows the semiconductor according to one of FIGS. 6-11 after a temperature process.

FIG. 12 shows a vertical cross-sectional view of the semiconductor arrangement 100 explained hereinbefore after such temperature process. Due to the diffusion of the implanted dopant atoms in the temperature process, a plurality of first regions 1 and second regions 2 are formed. Each of these first regions 1 and second regions 2 extends in the vertical direction of the semiconductor arrangement 100 across the semiconductor layers $110_1$-$110_n$. In horizontal directions, the first regions 1 and the second regions 2 may adjoin each other. According to another example (not shown) undoped section or sections having the basic doping concentration of the semiconductor layers $110_1$-$110_n$ may remain between neighboring first and second regions 1, 2. The first regions 1 are doped regions of the first doping type and result from the first implanted regions 11 and/or 12 and the second regions 2 are doped regions of the second doping type and result from the second implanted regions 21 and/or 22.

Figure 13:
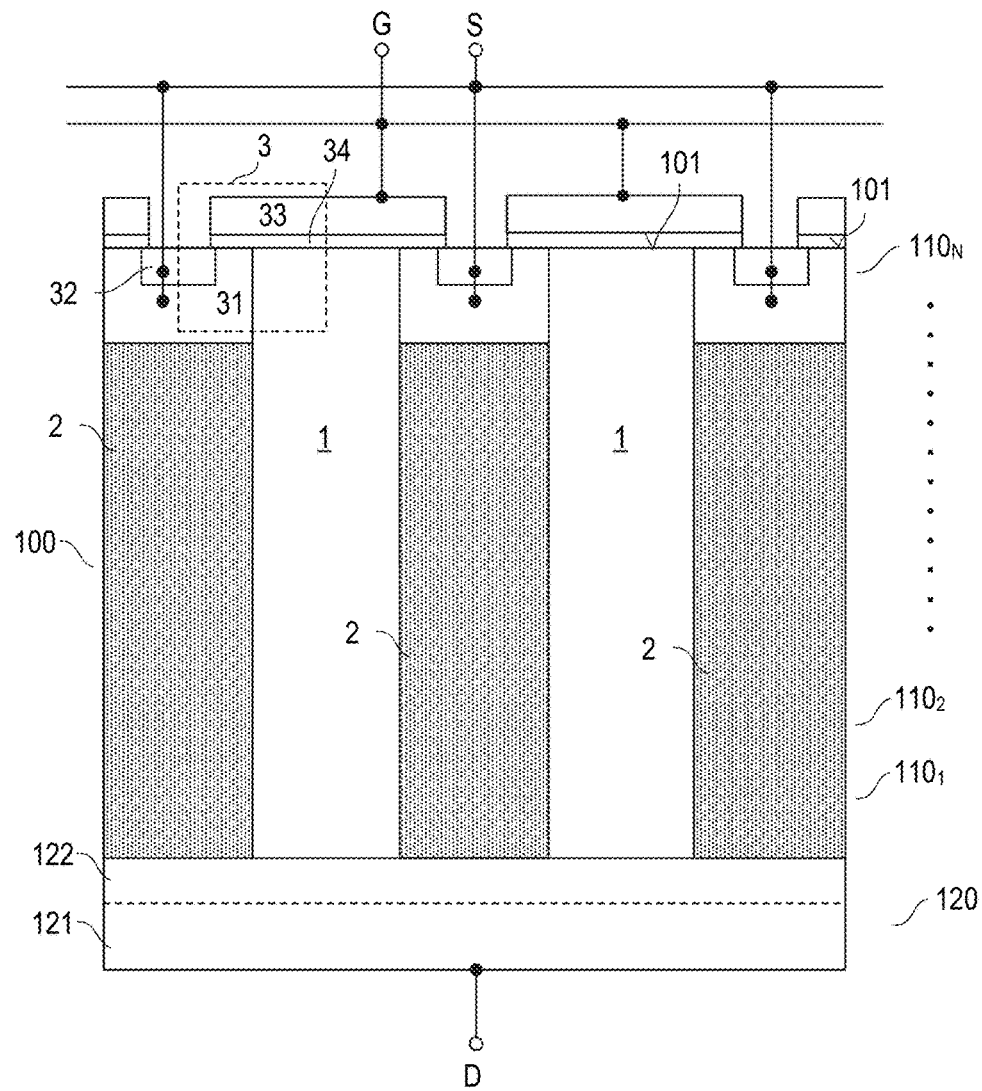
FIG. 13 shows a vertical cross-sectional view of the semiconductor body after forming transistor cells according to one example.

FIG. 13 shows a vertical cross-sectional view of a superjunction transistor device that includes a drift region with a plurality of first regions 1 and a plurality of second regions 2 as explained with reference to FIG. 12. In this superjunction transistor device, the carrier 120 or the substrate 121 (when the carrier includes a substrate 121 and a buffer layer 122) forms a drain region of the transistor device. The drain region is connected to a drain node D or forms a drain node D of the transistor device, wherein the drain node is only schematically illustrated in FIG. 13. The doping concentration of the drain region 120 is selected from a range of between 1E17 (=$10^{17}$) cm$^{-3}$ and 1E20 cm$^{-3}$, for example.

In the temperature process, dopant atoms from first and second implanted regions in the lowermost semiconductor layer $110_1$ may diffuse into the optional buffer layer 122. The buffer layer 122, however, is thick enough so that sections having the basic doping of the buffer layer remain between the first and second regions 1, 2 and the substrate 121 after the temperature process. Referring to the above, the lowermost semiconductor layer $110_1$ can be formed to have a basic doping of the first doping type and can be formed thicker than the remainder of the semiconductor layers. In this case, at the end of the temperature process, sections of the lowermost semiconductor layer $110_1$ may remain that have the basic doping of the first semiconductor layer $110_1$. Those sections adjoin the carrier 120 and form a buffer layer of the first doping type. Thus, a buffer layer of the transistor device may be formed by a buffer layer 122 formed on the substrate 121 before forming the semiconductor layers $110_1$-$110_N$, by a section of the lowermost semiconductor layer $110_1$, or by both.

In addition to the drain region 120 and the drift region with the first regions 1 and the second regions 2 the transistor device includes a control structure with a plurality of control cells 3, which may also be referred to as transistor cells. Each of these transistor cells 3 includes a body region 31 of the second doping type, a source region 32 of the first doping type, a gate electrode 33, and a gate dielectric 34.

The gate dielectric 34 dielectrically insulates that gate electrode 33 from the body region 31. The body region 31 of each transistor cell 3 separates the respective source region 32 of the transistor cell 3 from at least one of the plurality of first regions 1. The source region 32 and the body region 31 of each of the plurality of transistor cells 3 is electrically connected to a source node S (which is only schematically illustrated in FIG. 13). "Electrically connected" in this context means ohmically connected. That is, there is no rectifying junction between the source node S and the source region 32 and the body region 31. Electrical connections between the source node S and the source region 32 and the body region 31 of the individual transistor cells 3 are only schematically illustrated in FIG. 13. The gate electrode 33 of each transistor cell 3 is electrically connected to a gate node G (which is only schematically illustrated in FIG. 13).

Because the body regions 31 are of the second doping type and the first region 1 is of the first doping type there is a pn-junction between the body region 31 of each transistor cell 30 and the first region 1 adjoining the respective body region 31. Further, a pn-junction is formed between each first region 1 and an adjoining second region 2.

The body and source regions 31, 32 of the individual transistor cells can be formed conventional implantation and/or diffusion processes. Such processes for forming transistor cells of a transistor device are commonly known so that no further explanations are required in this regard. Forming the body and source regions 31, 32 may include a temperature process that activates dopant atoms introduced into the semiconductor body. According to one example, this temperature process is also used to activate the dopant atoms in the implanted first regions 11 and/or 12 and the dopant atoms in the implanted second regions 21 and/or 22, so that the first regions 1 and the second regions 2 are formed based on the first and second implanted regions after dopant atoms forming the body and source regions 31, 32 have been implanted.

The body and source regions 31, 32 may be produced in the uppermost semiconductor layer $110_N$ explained above. According to another example (not shown), a further semiconductor layer is grown on the uppermost layer $110_N$ and the body and source regions 31, 32 are formed in this further semiconductor layer. The further semiconductor layer may have a basic doping concentration of the first doping type, wherein this basic doping concentration may be in-situ formed during an epitaxial growth process of the further semiconductor layer.

In the example shown in FIG. 13, the gate electrode 33 of each transistor cell 3 is a planar electrode arranged on top of the first surface 101 of the semiconductor body 100 and dielectrically insulated from the semiconductor body 100 by the gate dielectric 34. In this example, sections of the first regions 21, adjacent the individual body regions 31, extend to the first surface 101.

Figure 14:
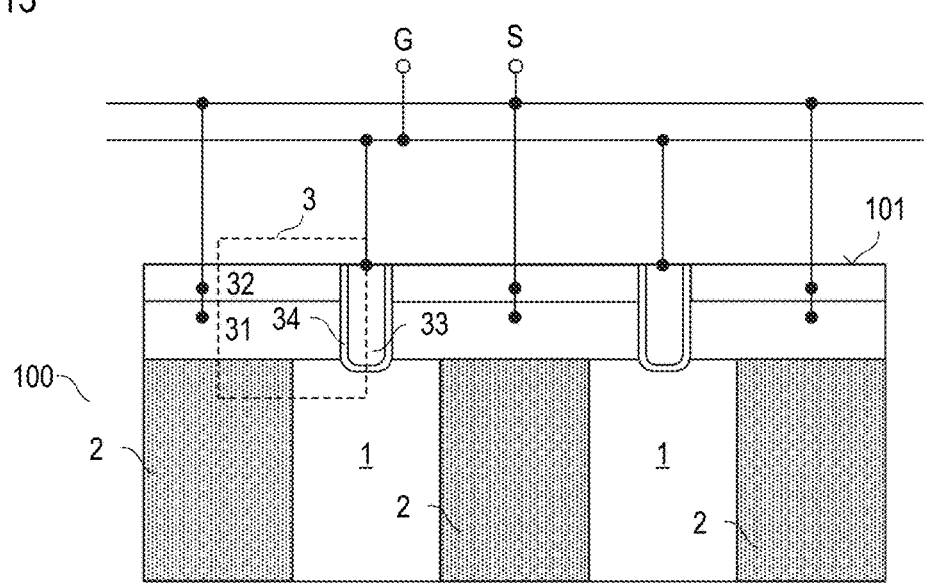
FIG. 14 shows a vertical cross sectional view of the semiconductor body after forming transistor cells according to another example.

FIG. 14 shows transistor cells according to another example, wherein in FIG. 14 only a section of the semiconductor body 100 close to the surface 101 is shown, which is the section in which the transistor cells 3 are implemented. The transistor cells shown in FIG. 14 are different from the transistor cells shown in FIG. 13 in that the gate electrode 33 of each transistor cell 3 is a trench electrode that extends from the first surface 101 into the semiconductor body 100. Like in the example shown in FIG. 13, a gate dielectric 34 dielectrically insulates the gate electrode 33 from the respective body region 31. The body region 31 and the source region 32 of each transistor cell 3 are electrically connected to the source node S. Further, the body region 31 adjoins at least one first region 21 and forms a pn-junction with the respective first region 21.

In the examples shown in FIGS. 13 and 14, the transistor cells 3 each include one gate electrode 33, wherein the gate electrode 33 of each transistor cell 3 is configured to control a conducting channel between the source region 32 of the respective transistor cell 3 and one first region 21, so that each transistor cell 3 is associated with one first region 1. Further, as shown in FIGS. 13 and 14, the body region 31 of each transistor cell 3 adjoins at least one second region 2, so that the at least one second region 2 is electrically connected to the source node S via the body region 31 of the transistor cell 3. Just for the purpose of illustration, in the examples shown in FIGS. 13 and 14, the body region 31 of each transistor cell 3 adjoins one second region 2 so that each transistor cell 3 is associated with one second region 2.

According to one example, a doping concentration of the source regions 32 is selected from a range of between 1E18 cm$^{-3}$ and 1E21 cm$^{-3}$, and a doping concentration of the body regions 31 is selected from a range of between 1E16 cm$^{-3}$ and 5E18 cm$^{-3}$. The gate electrodes 33 may include doped polysilicon, a metal, or the like.

Associating one transistor cell 3 of the plurality of control cells with one first region 1 and one second region 2, as illustrated in FIGS. 13 and 14, is only an example. The implementation and the arrangement of the transistor cells 3 widely independent of the specific implementation and arrangement of the first regions 1 and the second regions 2.

Figure 15:
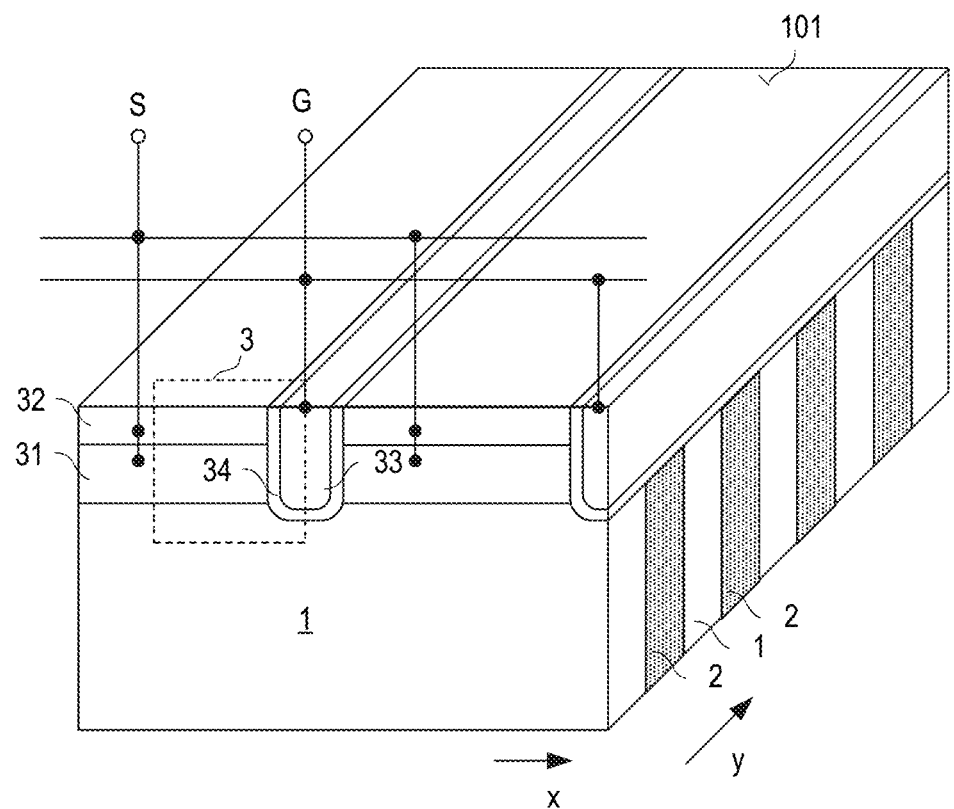
FIG. 15 shows a modification of the structure shown in FIG. 14.

One example illustrating that the implementation and arrangement of the transistor cells 3 are widely independent of the implementation and arrangement of the first and second regions 1, 2 is shown in FIG. 15, which illustrates a superjunction transistor device according to a further example. In this example, the first regions 1 and the second regions 2 are elongated in the first lateral direction x of the semiconductor body 100, while the source regions 32, the body regions 31, and the gate electrodes 33 of the individual transistor cells 3 are elongated in the second lateral direction y. In this example, the body region 31 of one transistor cell 3 adjoins a plurality of first regions 1 and second regions 2.

In the example shown in FIG. 15, the transistor cells are elongated transistor cells. That is, the body and source regions 31, 32 are elongated regions in a horizontal direction of the semiconductor body 100. This, however, is only an example. Other the transistor device may be implemented with other types of transistor cells such as polygonal cells as well.

Optionally, in the examples shown in FIGS. 14 and 15, the transistor device may include field electrodes (not shown) that are dielectrically insulated from the semiconductor body 100 by field electrode dielectrics, and connected to the source node S or the gate node G. According to one example, each of these field electrodes is located below a respective gate electrode 33 in the same trench as the gate electrode 33.

The functionality of a transistor device of the type explained herein above is explained below. The transistor device can be operated in a forward biased state and a reverse biased state. Whether the device is in the forward biased state or the reverse biased state is dependent on a polarity of a drain-source voltage $V_{DS}$, which is a voltage between the drain node D and the source node S. In the reverse biased state the polarity of the drain-source voltage $V_{DS}$ is such that the pn-junctions between the body regions 31 and the first regions 1 of the drift region are forward biased, so that in this operation state the transistor device conducts a current independent of an operation state of the control structure 3. In the forward biased state, the polarity of the drain-source $V_{DS}$ is such that the pn-junctions between the body regions 31 and the first regions 1 are reverse biased. In this forward biased state, the transistor device can be operated in an on-state or an off-state by the transistor cells 3. In the on-state, the transistor cells 3 generate a conducting channel between the source node S and the first regions 1, and in the off-state this conducting channel is interrupted. More specifically, referring to FIGS. 13 and 14, in the on-state there are conducting channels in the body regions 31 between the source regions 32 and the first regions 1 controlled by the gate electrodes 33. In the off-state, these conducting channels are interrupted. The gate electrodes 33 are controlled by a gate-source voltage $V_{GS}$, which is a voltage between the gate node G and the source node S.

The transistor device can be implemented as an n-type transistor device or as a p-type transistor device. In an n-type transistor device, the first doping type, which is the doping type of the first regions 1, the source regions 32, and the drain region 120 is an n-type and the second doping type, which is the doping type of the second regions 2 and the body regions 31, is a p-type. In a p-type transistor device, the doping types of the device regions mentioned before are complementary to the doping types of the respective device regions in an n-type transistor device. An n-type transistor device, for example, is in the forward biased state if the drain-source voltage $V_{DS}$ is a positive voltage. Furthermore, an n-type transistor device is in the on-state if the gate-source voltage $V_{GS}$ is positive and higher than a threshold voltage of the transistor device.

When the transistor device is in the on-state and forward biased, a current flows from the source node S via the conducting channels in the body regions 31 along the gate dielectrics 34 into the first regions 1 and in the first regions 1, in the vertical direction of the semiconductor body 100, to the drain region 120. When the transistor device is in the off-state and reverse biased, space charge regions (depletion regions) expand in the first and second regions 1, 2 of the drift region.

Figures 16A, 16B, 16C:
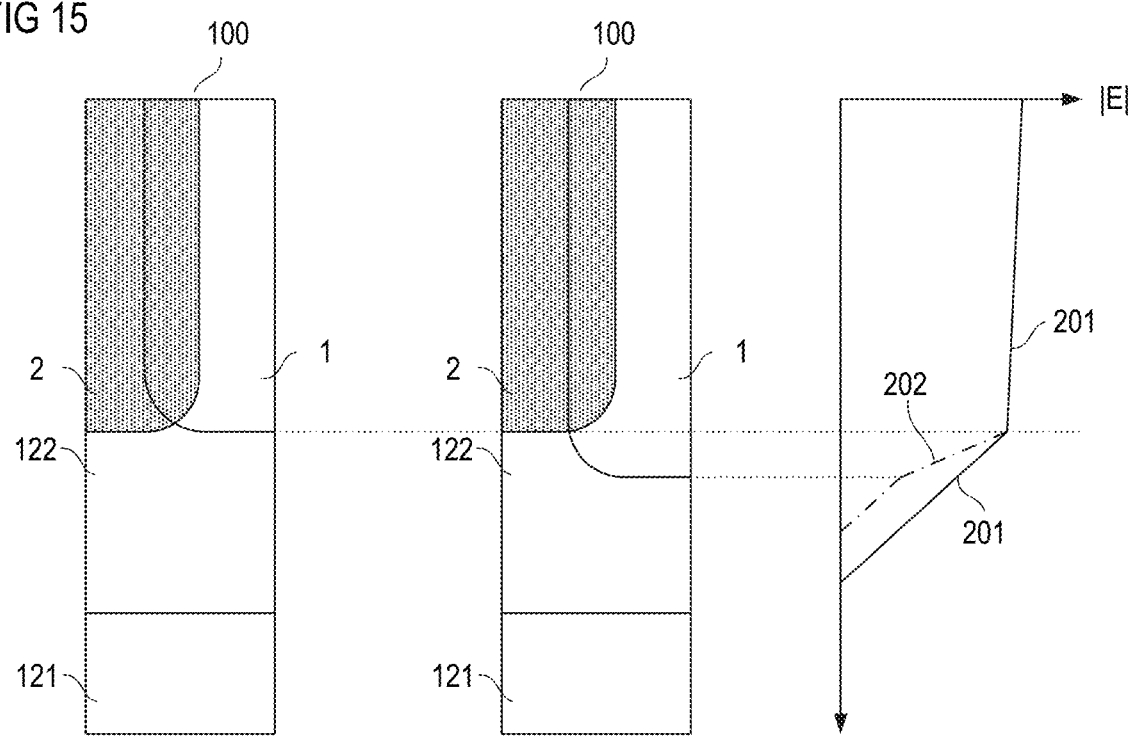
FIGS. 16A-16C illustrate sections of transistor devices and a field strength of an electric field occurring in these transistor devices in an off-state.

Referring to the above, channeling effects that may occur in a non-tilted implantation process may cause a variation of the implantation depth, wherein such variation in the implantation depth may cause variations of a resulting doping profile (after the temperature process). In a super-junction device, for example, it is desirable for the first and second regions 1, 2 to have essentially the same doping profile in those sections that face the carrier 120. More specifically, it is desirable for the first and second regions 1, 2 to end at essentially the same vertical position in the buffer region 122. This is illustrated in FIG. 16A that shows an enlarged view of a section of a first region 1, a section of an adjoining second region 2 and a section of the buffer layer 122. In this example, the first and second regions 1, 2 end at the same vertical position of the semiconductor body 100, that is, they have the same distance to the substrate 121. In the horizontal direction, the first and second regions 1, 2 may overlap (as illustrated). A profile of the first and second regions 1, 2 as shown in FIG. 16A may be obtained by forming the first and second implanted regions at least in the lowermost semiconductor layer $110_1$ using a tilted implantation process.

FIG. 16B shows an example in which the first region 1 extends farther in the direction of the substrate than the second region 2. This may result from variations in the implantation depth due to channeling. That is, a profile as shown in FIG. 16B may be obtained when the implanted regions in the lowermost layer $110_1$ are formed using a non-tilted implantation process.

FIG. 16C schematically illustrates the electric fields that may occur in the device section show in FIGS. 16A and 16B when the transistor device is in the off-state and a voltage is applied that reverse biases the pn-j unction between the first and second regions 1, 2 and between the second region and the buffer region 122, wherein curve 201 shown in FIG. 16C illustrates the field strength of an electric field associated with the device section shown in FIG. 16A and curve 202 shown in FIG. 16C illustrates the electric field associated with the device section shown in FIG. 16B. As can be seen from FIG. 16C, due to the compensation effect, the electric field is essentially constant or slightly decreases or increases in those sections where the first and second regions 1, 2 adjoin each other. In the buffer region 122, the electric field decreases, wherein the electric field decreases faster in the example shown in FIG. 16B, in which a section of the first region 1 extends deeper into the buffer region 122 than into the first region 1. The faster decrease of the electric field in this example is due to the fact that the section of the first region 1 extending into the buffer region 122 has a higher doping concentration than the buffer region 122.

A voltage blocking capability of the transistor device is the integral of the field strength of the electric field when a voltage is applied that causes the field strength, at one position of the transistor device, to reach a critical value (usually referred to as critical field strength). In other words, the voltage blocking capability is proportional to an area below the curve illustrating the field strength. As can be seen in FIG. 16C, this area is smaller in the case of the example shown in FIG. 16B than in the case of the example shown in FIG. 16A, so that the device illustrated in FIG. 16B has a lower voltage blocking capability than the device shown in FIG. 16A. Thus, forming the implanted regions in the lowermost semiconductor layer using a tilted implant may help to increase the voltage blocking capability or may help to avoid undesirable variations in the voltage blocking capability.

When the transistor device is in the off-state, dopant atoms in the first and second regions 1, 2 are ionized so that charge carriers are "stored" in these regions. When the transistor device switches from the off-state to the on-state, these charge carriers have to be removed before the transistor device can conduct a current. Switching losses, which are losses associated with switching on and switching off the transistor device, can be reduced by providing a low resistance between the second regions 2 and the source node S. Such low resistance, inter alia, can be obtained by providing a relatively high doping concentration of the second regions 2 in those sections where they adjoin the body regions 31. This can be obtained by forming the second implanted regions at least in the uppermost semiconductor layer $110_N$, in which also the body regions 31 are formed, using a tilted implantation process. Thus, it may be helpful to at least form the second implanted regions in the uppermost semiconductor layer $110_N$ using a tilted implantation process. While the invention has been described with reference to illustrative examples, this description is not intended to be construed in a limiting sense.

Although the present disclosure is not so limited, the following numbered examples demonstrate one or more aspects of the disclosure.

Example 1

A method, including: forming a plurality of semiconductor layers one above the other; implanting dopant atoms of a first doping type into each of the plurality of semiconductor layers, thereby forming a plurality of first implanted regions in each of the plurality of semiconductor layers; implanting dopant atoms of a second doping type into each of the plurality of semiconductor layers, thereby forming a plurality of second implanted regions in each of the plurality of semiconductor layers; wherein each of implanting the dopant atoms of the first doping type and implanting the dopant atoms of the second doping type into each of the plurality of semiconductor layers includes forming a respective implantation mask on a respective surface of each of the plurality of semiconductor layers, wherein at least one of forming the first implanted regions and the second implanted regions in at least one of the plurality of semiconductor layers includes a tilted implantation process, and wherein the tilted implantation process includes using an implantation vector that is tilted by a tilt angle relative to a normal of the respective horizontal surface of the respective semiconductor layer.

Example 2

The method of example 1, wherein the tilt angle is between 1° and 15° or between 2° and 8°.

Example 3

The method of any combination of examples 1 to 2, wherein the implantation vector has a horizontal vector component and a vertical vector component, wherein the implantation mask includes a plurality of elongated mask openings, and wherein the implantation vector is such that the horizontal vector component is at least approximately parallel to a longitudinal direction of the elongated mask openings.

Example 4

The method of any combination of examples 1 to 3, wherein the tilted implantation process includes a first implantation process using a first implantation vector and a second implantation process using a second implantation vector, wherein each of the first implantation vector and the second implantation vector has a horizontal vector component and a vertical vector component, wherein the vertical vector components of the first and second implantation vectors are essentially identical, and wherein the horizontal vector components of the first and second implantation vectors show in opposite directions.

Example 5

The method of any combination of examples 1 to 4, wherein the plurality of semiconductor layers include between 12 and 30 semiconductor layers.

Example 6

The method of any combination of examples 1 to 5, wherein more than 80% of the plurality of semiconductor layers each have a thickness of less than 2.5 micrometers, 2.0 micrometers, or less than 1.5 micrometers.

Example 7

The method of any combination of examples 1 to 6, wherein each of the plurality of semiconductor layers, before implanting the dopant atoms of the first type and the second type is undoped.

Example 8

The method of any combination of examples 1 to 7, wherein forming the plurality of semiconductor layers one above the other includes: forming one or more lowermost layers of the plurality of semiconductor layers on a semiconductor substrate, and forming the remainder of the plurality of semiconductor layers one above the other on the one or more lowermost layers.

Example 9

The method of any combination of examples 1 to 8, wherein each of the remainder of the plurality of semiconductor layers has a thickness of less than 2.5 micrometers, 2.0 micrometers, or less than 1.5 micrometers.

Example 10

The method of any combination of examples 1 to 9, wherein the one or more lowermost layers include a basic doping of the first doping type, and wherein each of the remainder of the plurality of semiconductor layers is undoped.

Example 11

The method of any combination of examples 1 to 10, wherein forming one of the first implanted regions and the second implanted regions in each of the plurality of semiconductor layers includes a tilted implantation process, and wherein forming the other one of the first implanted regions and the second implanted regions in each of the plurality of semiconductor layers includes a non-tilted implantation process.

Example 12

The method of any combination of examples 1 to 10, wherein forming the first implanted regions and the second implanted regions in at least one of the plurality of semiconductor layers includes a non-tilted implantation process, and wherein forming the first implanted regions and the second implanted regions in the remainder of the plurality of semiconductor layers includes a tilted implantation process.

Example 13

The method of any combination of examples 1 to 12, wherein the at least one of the plurality of semiconductor layers includes a lowermost one of the plurality of semiconductor layers.

Example 14

The method of any combination of examples 1 to 13, wherein the at least one of the plurality of semiconductor layers includes an uppermost one of the plurality of semiconductor layers.

Example 15

The method of any combination of examples 1 to 14, wherein the at least one of the plurality of semiconductor layers includes two or more semiconductor layers formed one above the other of the plurality of semiconductor layers.

Example 16

The method of any combination of examples 1 to 15, wherein forming the second implanted regions in a group of semiconductor layers of the plurality of semiconductor layers includes a non-tilted implantation process, wherein forming the second implanted regions in the remainder of the plurality of semiconductor layers includes a tilted implantation process, and wherein the group of semiconductor layers at least includes an uppermost semiconductor layer.

Example 17

The method of example 16, wherein forming the first implanted regions (11, 12) in the group of semiconductor layers comprises a tilted implantation process or a non-tilted implantation process.

Example 18

The method of any combination of examples 1 to 17, further including: a temperature process to diffuse the first type dopant atoms and the second type dopant atoms.

Example 19

The method of any combination of examples 1 to 18, further including: forming a plurality of transistor cells in an uppermost one of the plurality of semiconductor layers.

Example 20

The method of any combination of examples 1 to 19, further including: forming a further semiconductor layer on an uppermost one of the plurality of semiconductor layers; and forming a plurality of transistor cells in the further semiconductor layer.

Example 21

The method of any combination of examples 1 to 20, wherein forming the plurality of semiconductor layers one above the other includes epitaxially growing the plurality of semiconductor layers one above the other on a carrier.

Example 22

The method of any combination of examples 1 to 21, wherein the carrier includes a substrate and a buffer layer including at least one epitaxial layer formed on the substrate.

Various modifications and combinations of the illustrative examples, as well as other examples of the invention, will be apparent to persons skilled in the art upon reference to the description. It is therefore intended that the appended claims encompass any such modifications or examples.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   forming a plurality of semiconductor layers one on top of the other;
   implanting dopant atoms of a first doping type into each of the plurality of semiconductor layers, thereby forming a plurality of first implanted regions in each of the plurality of semiconductor layers; and
   implanting dopant atoms of a second doping type into each of the plurality of semiconductor layers, thereby forming a plurality of second implanted regions in each of the plurality of semiconductor layers,
   wherein each of implanting the dopant atoms of the first doping type and implanting the dopant atoms of the second doping type into each of the plurality of semiconductor layers comprises forming a respective implantation mask on a respective surface of each of the plurality of semiconductor layers,
   wherein at least one of forming the first implanted regions and the second implanted regions in at least one of the plurality of semiconductor layers comprises a tilted implantation process,
   wherein the tilted implantation process comprises using an implantation vector that is tilted by a tilt angle relative to a normal of the respective horizontal surface of the respective semiconductor layer.

2. The method of claim 1, wherein the tilt angle is between 1° and 15° or between 2° and 8°.

3. The method of claim 1, wherein the implantation vector has a horizontal vector component and a vertical vector component, wherein the implantation mask comprises a plurality of elongated mask openings, and wherein the implantation vector is such that the horizontal vector component is at least approximately parallel to a longitudinal direction of the elongated mask openings.

4. The method of claim 1, wherein the tilted implantation process comprises a first implantation process using a first implantation vector and a second implantation process using a second implantation vector, wherein each of the first implantation vector and the second implantation vector has a horizontal vector component and a vertical vector component, wherein the vertical vector component of the first and second implantation vectors are essentially identical, and wherein the horizontal vector component of the first and second implantation vectors point in opposite directions.

5. The method of claim 1, wherein the plurality of semiconductor layers comprises between 12 and 30 semiconductor layers.

6. The method of claim 1, wherein more than 80% of the plurality of semiconductor layers each have a thickness of less than 2.5 micrometers, 2.0 micrometers, or less than 1.5 micrometers.

7. The method of claim 1, wherein before implanting the dopant atoms of the first type and the second type, each of the plurality of semiconductor layers is undoped.

8. The method of claim 1, wherein forming the plurality of semiconductor layers one above the other comprises:
   forming one or more lowermost layers of the plurality of semiconductor layers on a semiconductor substrate; and
   forming the remainder of the plurality of semiconductor layers one on top of the other on the one or more lowermost layers.

9. The method of claim 8, wherein each of the remainder of the plurality of semiconductor layers has a thickness of less than 2.5 micrometers, 2.0 micrometers, or less than 1.5 micrometers.

10. The method of claim 8, wherein each of the one or more lowermost layers has a basic doping of the first doping type, and wherein each of the remainder of the plurality of semiconductor layers is undoped.

11. The method of claim 1, wherein forming one of the first implanted regions and the second implanted regions in each of the plurality of semiconductor layers comprises a tilted implantation process, and wherein forming the other one of the first implanted regions and the second implanted regions in each of the plurality of semiconductor layers comprises a non-tilted implantation process.

12. The method of claim 1, wherein forming the first implanted regions and the second implanted regions in at least one of the plurality of semiconductor layers comprises a tilted implantation process, and wherein forming the first implanted regions and the second implanted regions in the remainder of the plurality of semiconductor layers comprises a non-tilted implantation process.

13. The method of claim 12, wherein the at least one of the plurality of semiconductor layers comprises a lowermost one of the plurality of semiconductor layers.

14. The method of claim 12, wherein the at least one of the plurality of semiconductor layers comprises an uppermost one of the plurality of semiconductor layers.

15. The method of claim 12, wherein the at least one of the plurality of semiconductor layers comprises two or more semiconductor layers formed one on top of the other of the plurality of semiconductor layers.

16. The method of claim 1, wherein forming the second implanted regions in a group of semiconductor layers of the plurality of semiconductor layers comprises a tilted implantation process, wherein forming the second implanted regions in the remainder of the plurality of semiconductor layers comprises a non-tilted implantation process, and wherein the group of semiconductor layers at least comprises an uppermost semiconductor layer.

17. The method of claim 16, wherein forming the first implanted regions in the group of semiconductor layers comprises a tilted implantation process or a non-tilted implantation process.

18. The method of claim 1, further comprising:
performing a temperature process to diffuse the first type dopant atoms and the second type dopant atoms.

19. The method of claim 1, further comprising:
forming a plurality of transistor cells in an uppermost one of the plurality of semiconductor layers.

20. The method of claim 1, further comprising:
forming a further semiconductor layer on an uppermost one of the plurality of semiconductor layers; and
forming a plurality of transistor cells in the further semiconductor layer.

21. The method of claim 1, wherein forming the plurality of semiconductor layers one on top of the other comprises epitaxially growing the plurality of semiconductor layers one on top of the other on a carrier.

22. The method of claim 21, wherein the carrier comprises a substrate and a buffer layer comprising at least one epitaxial layer formed on the substrate.

* * * * *